(12) United States Patent
Steinberg et al.

(10) Patent No.: US 12,177,957 B1
(45) Date of Patent: Dec. 24, 2024

(54) METHOD FOR MAKING STATIC-DISSIPATIVE COMPOSITE STRUCTURE WITH EXPOSED CONDUCTIVE FIBER

(71) Applicant: Petro Guardian, L.L.C., Lacombe, LA (US)

(72) Inventors: Dan Steinberg, Blacksburg, VA (US); Robert Franklin Morris, III, Covington, LA (US); Benjamin Allen Hearst, New Orleans, LA (US)

(73) Assignee: Petro Guardian, L.L.C., Lacombe, LA (US)

( * ) Notice: Subject to any disclaimer, the term of this patent is extended or adjusted under 35 U.S.C. 154(b) by 101 days.

(21) Appl. No.: 18/317,403

(22) Filed: May 15, 2023

Related U.S. Application Data

(60) Continuation of application No. 17/513,250, filed on Oct. 28, 2021, now Pat. No. 11,653,437, which is a continuation of application No. 16/666,543, filed on Oct. 29, 2019, now Pat. No. 11,166,359, which is a continuation of application No. 15/683,782, filed on
(Continued)

(51) Int. Cl.
| | |
|---|---|
| *H05F 3/00* | (2006.01) |
| *B65D 90/46* | (2006.01) |
| *H05K 9/00* | (2006.01) |
| *H05K 13/00* | (2006.01) |
| *B64C 1/12* | (2006.01) |
| *B64D 45/02* | (2006.01) |
| *B67D 7/32* | (2010.01) |
| *F03D 80/30* | (2016.01) |
| *H05F 3/02* | (2006.01) |

(52) U.S. Cl.
CPC .............. *H05F 3/00* (2013.01); *B65D 90/46* (2013.01); *H05K 9/0079* (2013.01); *H05K 13/00* (2013.01); *B64C 1/12* (2013.01); *B64D 45/02* (2013.01); *B65D 2213/02* (2013.01); *B67D 7/3236* (2013.01); *F03D 80/30* (2016.05); *H05F 3/02* (2013.01)

(58) Field of Classification Search
CPC ....... H05F 3/00; B65D 90/46; B65D 2213/02; H05K 9/0079; H05K 13/00; B64C 1/12; B64D 45/00; B64D 45/02; F03D 80/30; B67D 7/3236
USPC .................................................. 361/212, 220
See application file for complete search history.

(56) References Cited

U.S. PATENT DOCUMENTS

2019/0193862 A1* 6/2019 Kinlen .................... H05B 3/145

* cited by examiner

*Primary Examiner* — Danny Nguyen
(74) *Attorney, Agent, or Firm* — Roy Kiesel Ford Doody & North, APLC; Brett A. North

(57) ABSTRACT

Provided is a method for making a composite structure with exposed conductive fibers. The exposed conductive fibers can be used for static dissipation. In the present method, a liquid, gum, gel, or impermeable film mask is applied to the conductive fiber material. The mask functions to prevent infiltration of curable liquid resin into the conductive fiber material. The masked conductive fiber material is incorporated into the composite structure, along with structural fiber material. The liquid resin is cured. The mask material and cured resin are removed from the masked areas, thereby exposing the conductive fiber material. The exposed conductive fiber material can collect and drain electrostatic charges. The present method can be used to make storage tanks and other objects that require electrostatic charge dissipation.

20 Claims, 8 Drawing Sheets

Related U.S. Application Data

Aug. 23, 2017, now Pat. No. 10,462,885, which is a division of application No. 14/192,806, filed on Feb. 27, 2014, now Pat. No. 9,775,223.

(60) Provisional application No. 61/852,780, filed on Mar. 21, 2013, provisional application No. 61/851,028, filed on Feb. 28, 2013.

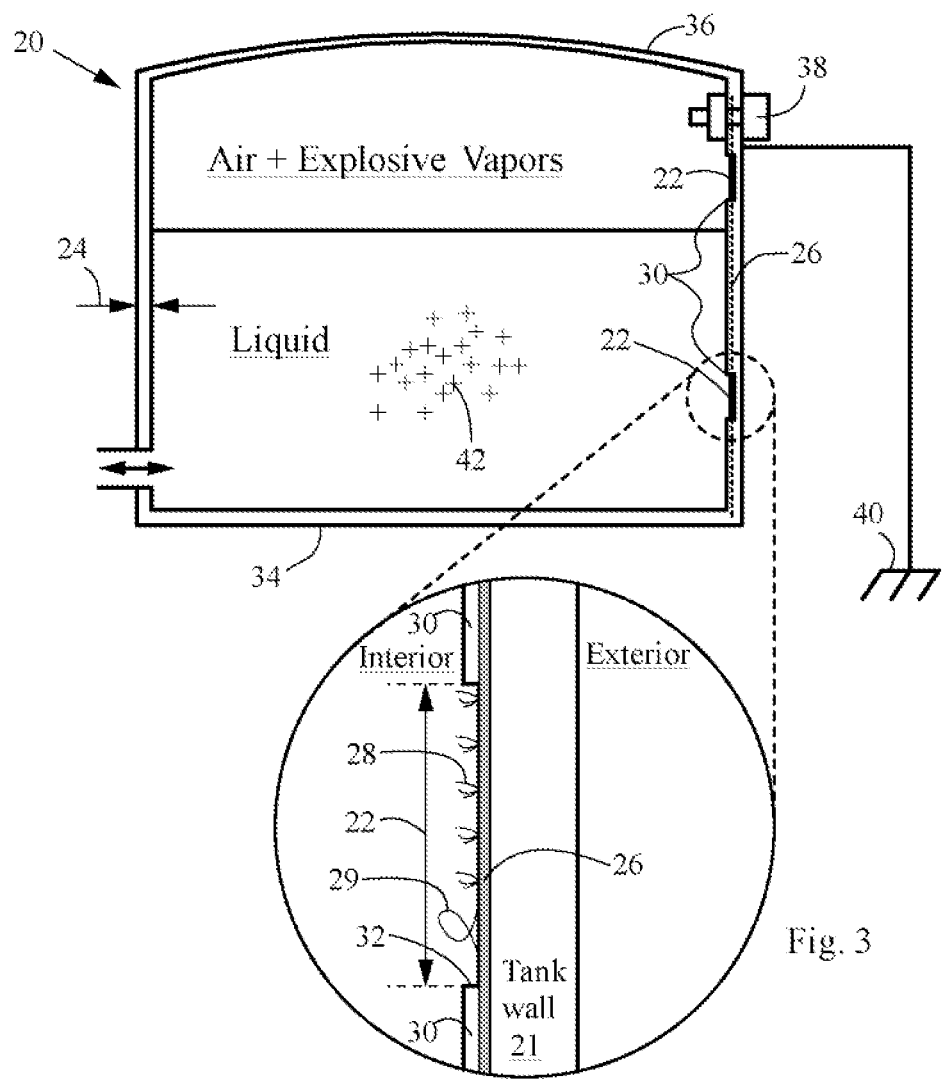
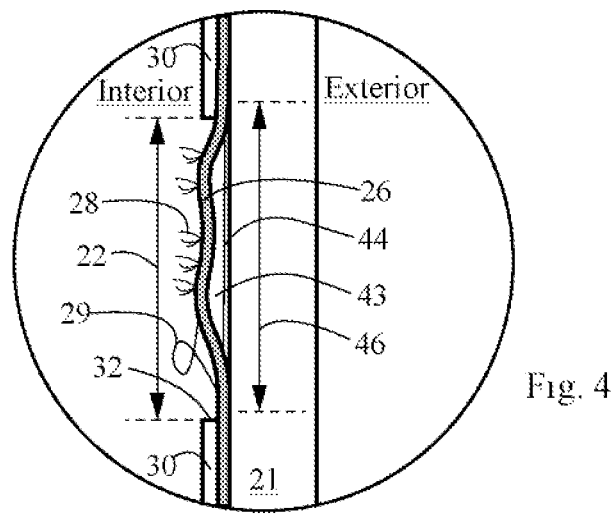
Fig. 3
Fig. 4

METHOD FOR MAKING
STATIC-DISSIPATIVE COMPOSITE
STRUCTURE WITH EXPOSED
CONDUCTIVE FIBER

CROSS-REFERENCE TO RELATED
APPLICATIONS

This is a continuation of U.S. patent application Ser. No. 17/513,250, filed on Oct. 28, 2021 (now U.S. Pat. No. 11,653,437), which is a continuation of U.S. patent application Ser. No. 16/666,543, filed on Oct. 29, 2019 (now U.S. Pat. No. 11,166,359), which is a continuation of U.S. patent application Ser. No. 15/683,782, filed on Aug. 23, 2017 (now U.S. Pat. No. 10,462,885), which is a divisional of U.S. patent application Ser. No. 14/192,806, filed on Feb. 27, 2014 (now U.S. Pat. No. 9,775,223), which claimed the benefit of both U.S. provisional patent application Ser. No. 61/852,780, filed on Mar. 21, 2013 and U.S. provisional patent application Ser. No. 61/851,028, filed on Feb. 28, 2013. Priority to/of each of the above referenced patent applications/patents is hereby claimed and each of these patent applications/patents is incorporated herein by reference.

BACKGROUND OF THE INVENTION

Field of the Invention

The present invention relates generally to explosion prevention and electrostatic charge dissipation. More particularly, the present invention relates to a method of making a composite storage tank or other objects having an integral conductive fiber material for electrostatic charge dissipation.

Background of the Invention

Liquid storage tanks are commonly used in petroleum production and at industrial facilities. These tanks are used to store petroleum products, contaminated wastewater, or process chemicals. These materials may contain flammable, volatile components that present an explosion hazard. If a tank contains flammable vapors and air, an electrostatic discharge can trigger a dangerous and costly explosion.

Consequently, electrostatic drain devices are sometimes employed inside storage tanks. The electrostatic drain device safely discharges electrostatic charges in the contained air and liquid to ground potential, thereby eliminating the possibility of an electrostatic explosion trigger.

FIG. 1 shows a conventional storage tank with an electrostatic drain according to the prior art. The tank 10 contains a liquid and a mixture of air and explosive vapors. The explosive vapors may comprise low molecular weight hydrocarbon vapors such as butane for example. The liquid flows into and out of the tank 10 via a pipe connection 11. As the liquid moves through the pipe, electrostatic charge is created in the liquid via well-known triboelectric effects. This electrostatic charge will become trapped in the tank if there is no conductive path to ground potential. The trapped electrostatic charge can trigger an explosion of the air and flammable vapor mixture.

Nonconductive tanks (e.g. made of polymers or fiberglass composite) are particularly problematic because they do not provide an electrically conductive path to ground potential. Metal tanks can also present a hazard if they are coated with an electrically insulating coating of epoxy or paint.

The prior art solution to this problem is to use a metal twisted wire brush 12 as an electrostatic drain. The metal wire brush device 12 is suspended inside the tank 10 and electrically connected to ground potential 13. The wire brush comprises a twisted cable 14 with embedded small diameter wires 15 (e.g. 0.001-0.020" diameter). The small diameter wires have sharp tips that serve to concentrate an electric field, and thereby facilitate charge collection. The wire brush 12 is typically made entirely of stainless steel. In operation, the drain device accumulates electrostatic charge present in the liquid and air, and provides a path for this charge to flow to ground potential 13.

The conventional solution of FIG. 1 is effective for dissipating electrostatic charge. However it has several serious disadvantages, including cost, susceptibility to corrosion, difficulty of installation (since the central twisted wire is rigid or semi-rigid), and tendency of the small wires to loosen and fall off over time. The small wires can loosen because they are held at only a single point where they pass through the twisted cable. Hence if corrosion causes one wire to dislodge, then all other wires in the same bundle will fall out as well. Small wires or corroded metal particles that fall into the liquid can damage downstream equipment. Consequently, the wire brush 12 presents a significant hazard for liquid-handling equipment such as filters, valves and pumps.

Corrosion is a great concern at petroleum facilities because the liquids in the tank often contain combinations of salts, acids, hydrogen sulphide and other substances that corrode many types of metals, including stainless steel. This is one reason why non-metallic tanks are preferred for these applications.

Fiberglass tanks are corrosion resistant, but because they are electrically insulating, fiberglass tanks are an explosion hazard.

FIG. 2 shows a conventional method for fabricating a composite-fiberglass tank. A cylindrical mandrel 16 is used as a mold that defines the internal shape and dimensions of the tank. A fiberglass strip 17 is soaked in curable liquid resin (e.g. polyester resin) and wrapped around the mandrel. The fiberglass strip can also be wrapped in a diagonal or zigzag fashion. After the mandrel is covered with resin-soaked fiberglass, the resin is cured, and the resulting tube is removed from the mandrel. Bottom and top covers (not shown) are attached to enclose the ends of the tube. A problem with this method is that all inside surfaces of the tank are electrically non-conductive due to a thin layer of non-conductive resin coating the inside surfaces. Even when conductive carbon fiber is used instead of fiberglass, the inside surface of the tank is electrically non-conductive due to the layer of cured resin on the interior tank surface.

It would be a great advantage and improvement in the art to provide a composite fiber tank, pipes or other objects with integral electrostatic charge dissipation.

SUMMARY OF THE INVENTION

Provided is a method for making a static-dissipating composite structure such as a tank. The method includes the steps of:
1) applying a mask to portions of a conductive fiber material (e.g. carbon fiber),
2) disposing the masked conductive fiber material on a tank mandrel,
3) disposing structural fiber material (e.g. fiberglass) and liquid resin (e.g. polyester resin, epoxy) on the masked conductive fiber material and mandrel, 4) curing the resin,
5) releasing the structure from the mandrel, and
6) removing the mask material from the conductive fiber, thereby exposing the conductive fiber in previously masked areas. The exposed conductive fiber can collect electrostatic charge and drain it to ground potential.

Impermeable film can be used as a mask on one or both sides of the conductive fiber material. The mask can also comprise a liquid or gel material, such as polyvinyl alcohol, or plant gums dissolved in water. Liquid/gel mask preferably infiltrates into the conductive fiber material. The mask material can comprise a water-soluble substance, and removing the mask can comprise rinsing the masked areas with water. The liquid mask material can be insoluble or immiscible with the liquid resin.

Alternatively, the mask material can be applied to the conductive fiber material while it is on the mandrel. For example, the impermeable film can comprise adhesive tape, which can also function to hold the conductive fiber material on the mandrel.

Removing the mask can also include removing some cured resin material. After assembly, a layer of resin material might cover the masked areas of the conductive fiber material.

The conductive fiber material can be applied to the mandrel by wrapping around the mandrel (e.g. in a spiral), or laying strips (e.g. straight strips) on the mandrel.

The mask material can comprise impermeable film such as adhesive tape. The impermeable film can be wrapped around the conductive fiber material. The impermeable film can be used to attach the conductive fiber material to the mandrel.

The present invention also includes a method for attaching a conductive fiber material to a surface, for example for static dissipation. The method comprises the steps of:
1) applying mask to portions of a conductive fiber material,
2) disposing the masked conductive fiber material on the surface,
3) applying liquid resin to the conductive fiber material,
4) curing the resin, and
5) removing the cured resin and mask from masked areas of the conductive fiber material.

The mask can comprise a liquid or gel mask material, and/or impermeable film. The impermeable film can comprise adhesive tape for example. The impermeable film can also function to hold the conductive fiber material on the tank surface, while liquid resin is applied.

The conductive fiber material can be attached to the tank wall before or the same time as mask is applied.

The present invention also includes a charge-dissipating panel comprising structural fiber embedded in a resin material, a conductive fiber material embedded in the panel, and an open area disposed on a surface of the panel, wherein the open area overlaps the conductive fiber material, and the conductive fiber material is exposed in the open area.

BRIEF DESCRIPTION OF DRAWINGS

FIG. 3 shows a static-dissipative tank according to the present invention.
FIG. 4 shows a close-up view of an open area with exposed conductive fiber according to the present invention.

DETAILED DESCRIPTION OF THE INVENTION

Figure 1:
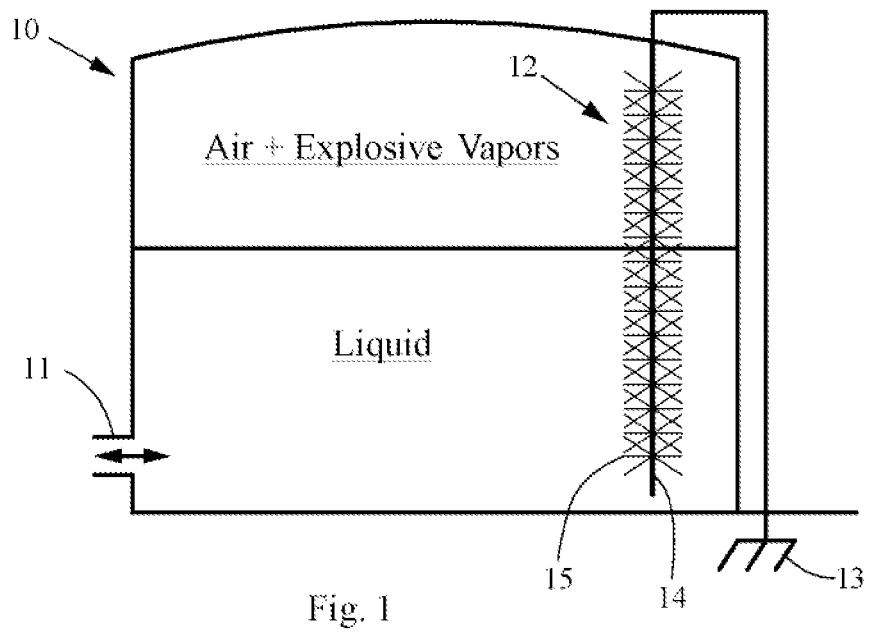
FIG. 1 (Prior Art) shows a storage tank with a conventional stainless steel brush electrostatic charge dissipater.
Figure 2:
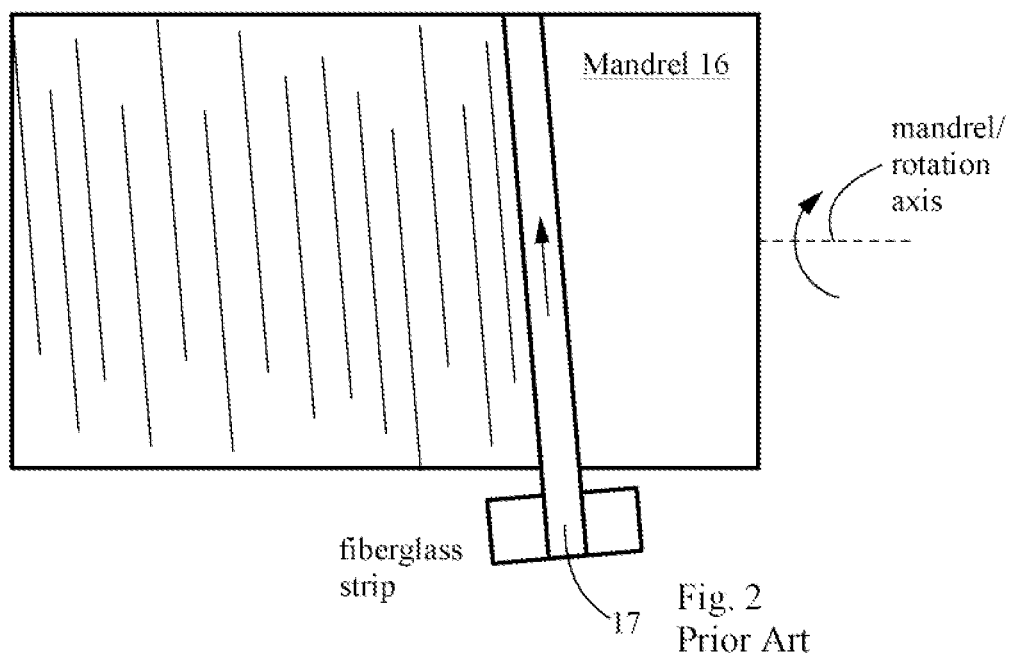
FIG. 2 (Prior Art) shows a conventional method for making a fiberglass or carbon fiber tank.

The present invention provides a method for making a storage tank or other object with electrically conductive fibers for collecting and removing electrostatic charge. The electrically-conductive fibers are exposed (i.e. not covered with non-conductive material such as resin) on inside surfaces of the tank. When connected to a ground potential, the conductive fibers remove electrostatic charges from inside the tank. The present tank is made by covering portions of the electrically conductive fiber with a mask material that inhibits infiltration by nonconductive resin. The conductive fibers are wrapped around a tank mandrel, followed by wrapping structural fibers (e.g. fiberglass or carbon fiber) and resin, as known in the art. After removing the tank from the mandrel, cured resin and mask are removed from masked areas of the conductive fiber, thereby exposing the conductive fiber on inside surfaces of the tank. Cured resin does not permanently adhere to the conductive fiber in masked areas. The exposed areas of the conductive fiber function to collect electrostatic charge. The mask can comprise high viscosity liquids, thixotropic gels, plant gums, mold-release agents, silicone oil or grease, and/or impermeable films such as polyester, polyimide, polyethylene, or polyethylene terephthalate film, or metal foil.

Definitions

Exposed: Lacking a nonconductive coating such as a resin coating (e.g. polyester or epoxy), or paint. The surface of exposed electrically conductive fiber is electrically conductive.

Conductive fiber material: Fibrous material having electrical conductivity and continuity sufficient for collecting electrostatic charge. Fiber diameter can be in the range of 1-1000 microns for example. Suitable conductive fibers include carbon fiber, conductive polymers, or polymer composites comprising non-conductive polymeric matrix with additives such as carbon nanotubes, carbon black, metal particles, chopped carbon fiber or the like. Also, the conductive fiber material definition includes metallic fibers or fine wires.

Mask: A solid, liquid, gel, film or sheet material effective for preventing infiltration of liquid resin into the conductive fiber material.

Resin: A hardenable liquid material used to form the matrix of a fiber composite material. Typical resin materials include polyester resin and epoxy.

Infiltrate: To flow into pores or interstices of a material, such as the spaces between individual fibers in a fiberglass or conductive fiber material. Infiltration may or may not be associated with wetting or capillary action.

FIG. 3 shows a tank 20 according to the present invention, and a magnified view of an open area 22 on an inside surface of the tank. The tank 20 has walls 21 with a thickness 24. The thickness can be about 1/16"-1" for example. The tank wall 21 can be made of polyester-fiberglass, carbon fiber-epoxy composite for example. The tank walls 21 have embedded strips of conductive fiber material 26. In FIG. 3, the conductive fiber material 26 is seen edge-on. The conductive fiber material 26 can comprise carbon fiber, or other electrically conductive material. The conductive fiber 26 is exposed in the open areas 22. In the open areas 22, the conductive fiber material has broken fiber tips 28 or stray fibers 29 projecting away from the conductive fiber material 26. The conductive fiber material 26 is not covered with cured resin in the open areas 22.

In locations outside the open areas 22, a resin covering 30 is present. The resin covering 30 is missing in the open areas. The resin covering 30 can be made of the same resin comprising the tank wall. The resin covering can be vanishingly thin, or can have thicknesses of about 0.001"-0.020" for example. The thickness of the resin covering 30 will vary from place to place and in some places can be almost zero. It is possible for the conductive fiber material 26 to be present at the surface of the resin covering 30. However, the broken fiber tips 28 and stray fibers 29 will generally not be present in locations covered by the resin covering 30. Consequently, the resin covering 30 mostly blocks electrostatic charge accumulation in areas where it covers the broken fiber tips 28 and stray fibers 29.

As explained below, the resin covering 30 is mechanically removed (after curing) from open areas 22. Consequently, edges 32 of the open areas 22 may show signs of ripping, cutting or shearing of the resin covering 30.

Also, in the open area 22 the conductive fiber 26 may or may not be adhered to the tank wall. In other words, in the open area 22, the conductive fiber material 26 may be partially embedded in the cured resin comprising the tank wall 21 or, alternatively, in the open area 22 the conductive fiber material 26 may be completely unattached to the tank wall. The conductive fiber material 26 can be floppy and unrestrained in the open area 22.

The conductive fiber material 26 extends along the tank wall, for example between a tank bottom 34 and a tank top 36. A tank can have a single strip of conductive fiber material 26, or a plurality or many strips of conductive fiber material 26. The strips of conductive fiber material can be spiral-wound around the tank, or can be arranged in straight, parallel vertical strips or in any other pattern. The present invention is not limited to any particular number or arrangement of conductive fiber material strips.

A bolt 38 extending through the tank wall 21 can function as an electrical feedthrough, providing an electrical connection between the conductive fiber material 26 and ground potential 40. The bolt 38 is optional in the invention. There are many other ways to provide an electrical ground connection to the conductive fiber material 26.

The bolt 38 can be located in an open area 22 to facilitate good electrical contact between the bolt 38 and the conductive fiber material 26.

In operation, electrostatic charge 42 accumulates in the tank 20. The charge 42 can be produced by triboelectric charge separation caused by movement of the liquid, as known in the art. Electrostatic charge may also be present in the air inside the tank. The electrostatic charge 42 is collected by the broken fiber tips 28 and stray fibers 29 in the open areas 22. The charge flows through the conductive fiber material 26, to the bolt 38 and then to the ground potential 40. The present tank will collect charge from both liquid and gases in the tank. The resin covering 30 generally prevents the conductive fiber material 26 from collecting much charge in locations outside the open areas 22. However, in locations where the resin covering 30 is extremely thin, the conductive fiber material may collect some charge.

In some embodiments, cured resin is infiltrated into the conductive fiber material 26 in areas outside the open areas 22 (i.e. in areas where conductive fiber material 26 is covered by resin covering 30).

The electrostatic charge 42 may come into contact with the conductive fiber material 26 as the liquid or gases circulate inside the tank. Also, the electrostatic charge 42 will be attracted to the conductive fiber 26 and flow toward the open areas 22 due to electrostatic forces, as known in the art. When electrostatic charges are eliminated from the tank, the risk of an electrostatic-spark triggered explosion is greatly reduced.

FIG. 4 shows a close-up view of a open area 22 according to an embodiment in which the conductive fiber material 26 is not adhered to the tank wall 21 in the open area 22. An optional space 43 can be present between the conductive fiber material 26 and the tank wall 21. An impermeable film 44 is optionally disposed between the tank wall 21 and the conductive fiber material 26. The impermeable film 44 may be adhered to the tank wall 21 by the cured resin comprising the tank wall 21. The impermeable film 44 covers an area 46 that roughly matches the open area 22. The impermeable film 44 can be larger or smaller than the open area 22.

The impermeable film 44 can comprise a polymeric material that is resistant to and impermeable to the uncured resin used to make the tank wall 21. For example, the impermeable film can comprise polyester film, polyimide film, or polyethylene (e.g. HDPE) film. Alternatively, the film 44 can comprise paper, waxed paper, masking tape, metal foil, such as aluminum, copper, brass or stainless steel foil. The impermeable film may be a piece of adhesive tape, and have a residual layer of adhesive on one or both sides. For example, the impermeable film 44 may have a layer of adhesive on the side facing the conductive fiber material 26.

The impermeable film 44 is an artifact of the method used for fabricating some embodiments of the present invention. As explained below, the impermeable film 44 prevents uncured liquid resin from infiltrating the conductive fiber material 26 during tank assembly. Masking results in the fiber material 26, broken fiber tips 28 and stray fibers 29 being exposed able to collect electrostatic charges. Broken fiber tips 28 and stray fibers 29 will have reduced ability to collect electrostatic charge if covered by the resin covering 30.

The conductive fiber material 26 of the present invention can comprise many different electrically conductive fibers, such as carbon fiber, intrinsically conductive polymers, conductive polymer composite materials, or metallic fibers or wires. The conductive fiber material can comprise continuous fibers or collections of discontinuous fiber pieces. The conductive fiber material comprises a continuous electrical conductor, so that it can transport electrical charge from the open area 22 towards the ground potential 40.

In embodiments where non-carbon fibers are used, the fibers can comprise many different types of conductive or static-dissipative plastics or polymers. The plastics or polymers used can be intrinsically conducting (e.g. polyaniline, polypyrrole, polyacetylene) or can be conductive due to embedded conductive fibers, particles, carbon or nanowires (i.e. "conductive polymer composites"). Such conductive plastics and polymers are known in the art. Examples of plastics and polymers suitable for use include composites based on polypropylene, polyethylene, and nylon.

Conductive polymer composites can be made by incorporating many types of conductive particles, such as carbon black, carbon nanotubes, chopped carbon fiber, graphite powder, metal particles (e.g. aluminum powder), or metal fibers. These conductive materials can be incorporated into many different types of plastics or polymers that can be extruded or spun into fibers suitable for use in the present invention.

The conductive fiber material 26 used in the present dissipater can have a wide range of electrical resistance values, for example in the range of 0.1 to $1 \times 10^9$ ohms or $1 \times 10^3$ to $1 \times 10^6$ ohms per linear foot. Embodiments using carbon fiber will generally have a low resistance of under 100 ohms per linear foot. Embodiments comprising conductive plastic fibers will typically have higher resistance values, depending on the specific material, and the amount of conductive material embedded in the plastic fibers. The optimal electrical resistance will depend on several factors including: the desired relaxation time for removing electrostatic charges in the tank, the rate of charge accumulation in the tank, and the maximum tolerable amount of charge in the tank.

The fiber tips 28 and stray fibers 29 preferably have a length of at least about 0.010", 0.020", 0.050", 0.10" or 0.25". The distance they project away from the fiber material 26 will change with local electric field strength and fluid movement forces. Typically with carbon fiber, the tips may project up to about 0.50" or 1" from the material; however, the present invention and appended claims are not limited to any particular length of the broken fibers 28 and stray fibers 29.

Preferably the broken fiber tips 28 and stray fibers 29 are present in a density of at least about 1, 10, 20, 100, or 200 per square inch. The density of broken fiber tips and stray fibers will typically be lower for embodiments having large-diameter fibers (e.g. 250-1000 microns), and higher for embodiments having small-diameter fibers (e.g. 1-20 microns). The density of broken and stray fibers can be increased by mechanical damage. The conductive fiber material can be abraded (e.g. rubbed with sandpaper), partially broken, partially cut or otherwise damaged (e.g. by crushing, incising, clipping, sandblasting, laser ablation, pulling, unwinding or shearing) to increase the number of broken fiber tips 28 and/or individual stray fibers 29. Carbon fibers are brittle and so broken fiber tips can be formed by bending the carbon fibers to a small radius of curvature.

The conductive fiber material 26 can be in the form of a fiber bundle, a braided or woven fabric of fiber yarns, or a braided sleeve of fiber yarns, or felt (i.e. tangled or nonwoven mat of fibers). The conductive fiber material can be in the shape of an elongated, flat strip. For example, the conductive fiber material can be about 0.05"-0.10" thick, 0.25"-12" wide, and tens or hundreds of feet long for example. The present invention is not limited to any particular width, thickness, weave pattern or length of the conductive fiber material.

The open areas 22 can vary widely in size. Typical sizes may be for example in the range of 0.5"×0.5" to 12'×12".

The number and spacing of open areas 22 can also vary widely. A single, dozens, hundreds, or thousands of open areas 22 can be present in a tank or other structure. Also, the open areas 22 can be spaced apart by inches or feet. The present invention is not limited to any particular size, spacing, shape, number or density of open areas 22.

Figure 5:
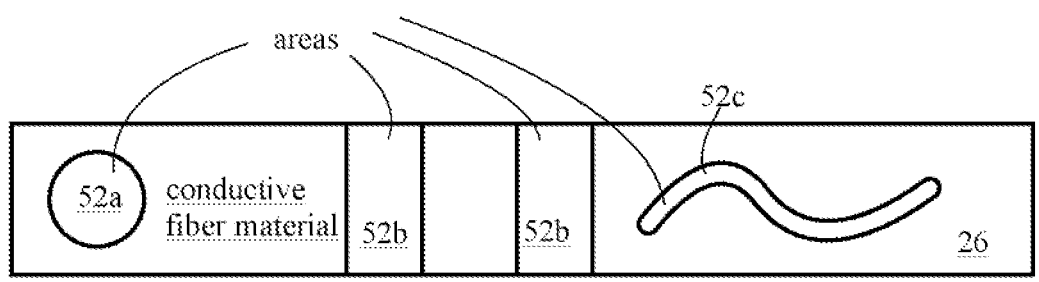
FIG. 5 shows a piece of conductive fiber material with masked areas of different shapes.

FIG. 5 shows a strip of conductive fiber material 26, illustrating a first step in a method according to the present invention. Masked areas 52*a* 52*b* 52*c* of the fiber material 26 are covered with a mask material.

As noted above, the fiber material 26 can comprise carbon fiber fabric or carbon fiber braided sleeve, for example.

The masked areas can be any arbitrary shape and can be arranged in any arbitrary pattern. The masked areas can be surrounded by unmasked areas (like masked areas 52*a*, 52*c*) or can extend to edges of the fiber strip (like masked areas 52*b*).

The mask material can be any material that prevents infiltration into the fiber material 26 by the resin used for constructing the tank, such as polyester resin or epoxy.

The mask material can comprise a thick gel, such as polyvinyl alcohol (e.g. 1-10% concentration) or plant-based gums (e.g. xanthan gum, guar gum) dissolved in water. The mask material can also comprise mold-release agents, silicone oil, natural triglyceride oils or grease for example. Preferably, the mask material is not soluble or miscible in the uncured resin material used for constructing the tank. Also preferably, the mask material is removable with a solvent or cleanser, such as water, hot soapy water or alcohol for example.

The mask material preferably wets and infiltrates the conductive fiber material 26 in the masked areas 52. Also, the mask can be viscous so that it does not flow long distances away from the masked areas 52 by capillary action. The mask preferably stays where it is applied and does not run, flow or drip off the conductive fiber material 26. Optionally, the mask material is partially or completely dried or hardened. For example, the mask material can be dried to a leathery, thixotropic or rubbery consistency. Plant gums for example can be dried to obtain such properties for example. Preferably, the mask material is removable with the solvent or cleanser even in a dried or partially-dried state.

FIGS. 6A-6F illustrate further steps for making a static dissipative tank according to the present invention.

Figure 6A:
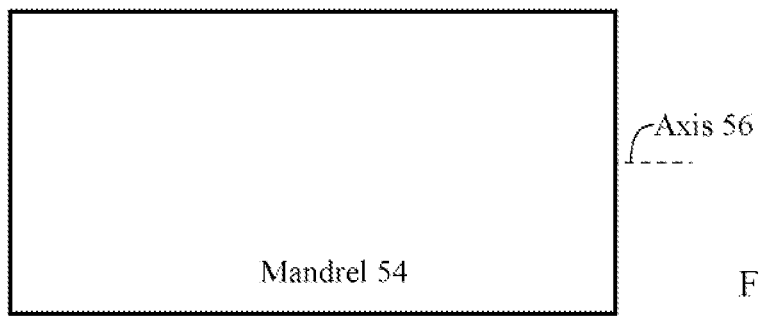
FIGS. 6A-6F illustrates a method for making a tank according to the present invention.

FIG. 6A: A side view of a cylindrical mandrel 54 for making a cylindrical fiber-composite tank. The mandrel 54 has an axis of rotation 56. The mandrel can be made of metal and can be collapsible, as known in the art of fiberglass tank manufacturing. A mandrel is essentially a mold for making a tank. Tank mandrels are well known in the art of fiberglass tank manufacturing.

Figure 6B:
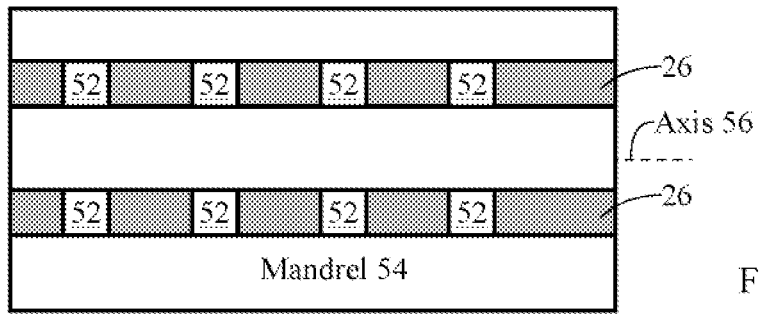

FIG. 6B: Strips of masked conductive fiber material 26 are placed on the mandrel. The fiber material 26 has masked areas 52, as explained above. The fiber material 26 can be adhered to the mandrel by the mask material, by uncured resin used to manufacture the tank, by adhesive tape or by other means. For example, in embodiments where impermeable film is used as a mask, the impermeable film can comprise adhesive tape that is used to attached the conductive fiber material to the mandrel 54.

Figure 6C:
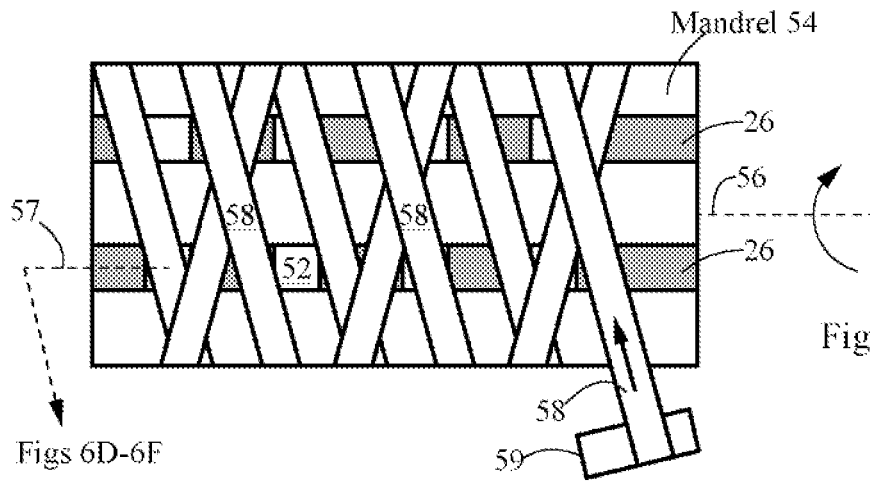

FIG. 6C: The mandrel 54 is rotated, and structural fiber strip 58 (e.g. comprising fiberglass or carbon fiber) is wound around the mandrel 54. The structural fiber is soaked in uncured, liquid resin. The structural fiber strip 58 may be unwound from a spool 59. The structural fiber 58 is wound onto the mandrel until the conductive fiber strips are completely covered and the tank walls 21 are formed. Liquid resin may infiltrate into (e.g. by capillary action) the conductive fiber material 26 in unmasked areas. The liquid resin is inhibited from infiltrating the conductive fiber material 26 in masked areas 52. After winding, the resin is cured, as known in the art.

Figure 6D:
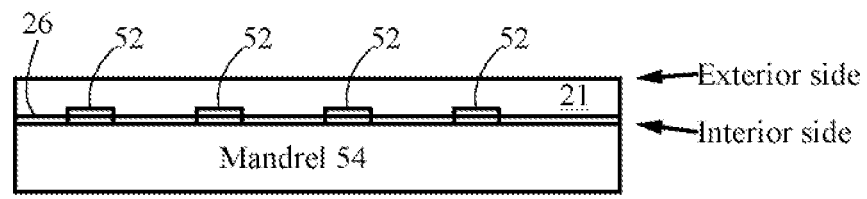

FIG. 6D: Shows a cross sectional view of the tank wall after the structural fiber 58 has been applied. The cross sectional view is along line 57 illustrated in FIG. 6C. The conductive fiber material 26 is seen edge-on. The tank wall 21 is formed from multiple layers of structural fiber 58 and cured resin.

Figure 6E:
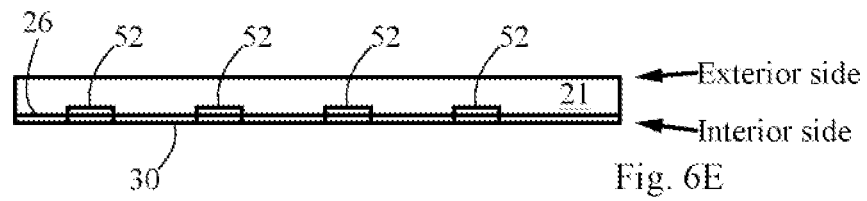

FIG. 6E: The tank is separated from the mandrel. This exposes the tank interior and the resin covering 30. At this stage, the resin covering 30 most likely covers the entire interior surface, including the masked areas 52. However, it is possible that portions of the resin covering 30 over the masked areas are pulled away by and remain adhered to the mandrel 54. It is also possible that the liquid resin did not flow under the masked areas 52 of the fiber material 26.

Figure 6F:
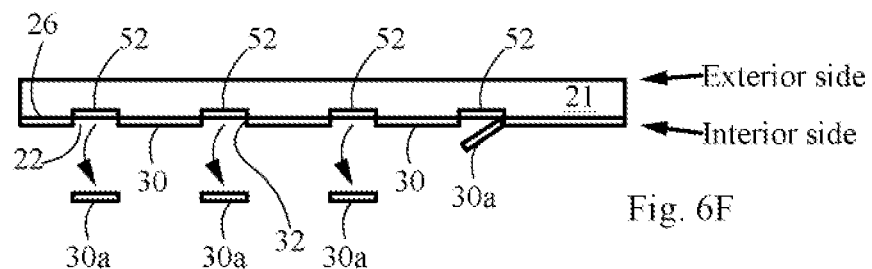

FIG. 6F: Resin covering sections 30a are removed from masked areas 52 of the conductive fiber material 26. The mask material facilitates removal of the resin covering sections 30a because the mask material prevents bonding between the resin and the conductive fiber material 26. For example, the resin covering section 30a can have poor adhesion to the mask material, or the mask material can have poor adhesion to the conductive fiber material 26. Removal of the resin covering sections 30a creates open areas 22 where the conductive fiber material 26 is exposed.

The resin covering sections 30a can be removed by hand with a scraping tool such as a knife or wire brush. Also, high-pressure water spray could be used. As the resin covering sections 30a are removed, edges 32 might be formed with cut, broken or sheared surfaces.

After resin covering sections 30a are removed, the exposed conductive fiber material 26 can be rinsed and cleaned to remove remaining mask material. If the mask material is made of a water-soluble material such as polyvinyl alcohol or plant-based gums, then hot water can be used to remove the mask material. Alternatively, the tank may be put in service without cleaning the mask material, and the liquids contained in the tank will wash away the mask material.

Also, the conductive fiber material 26 in the open areas can be abraded or otherwise damaged to increase the number of broken fiber tips 28 or stray fibers 29.

Figure 7:
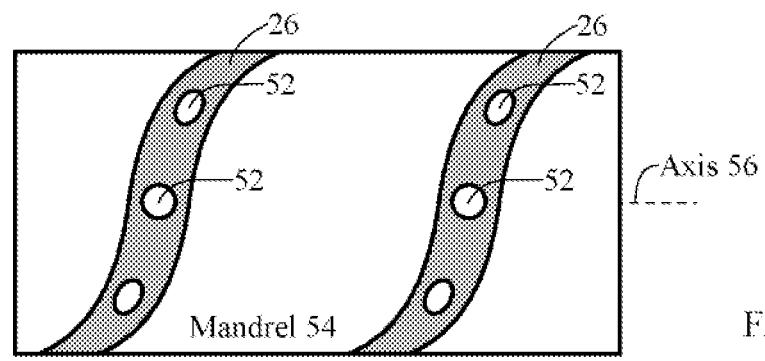
FIG. 7 shows masked conductive fiber material wrapped around a mandrel, according to an alternative method for making a tank according to the present invention.

FIG. 7 shows a manufacturing step according to an embodiment in which the conductive fiber material 26 is wrapped in a spiral around the mandrel 54. The masked areas 52 can be distributed along the length of the conductive fiber material 26. After the masked fiber material 26 is applied to the mandrel, the structural fiber 58 is wrapped around the mandrel as illustrated in FIG. 6C and the tank is completed in the same manner.

The mask material can comprise many different substances. Preferably, the mask material has a high viscosity so that it does not flow, drip, or spread excessively. Preferably, the mask material is viscous enough to remain in the mask areas 52. Possible mask materials include polyvinyl alcohol dissolved in water, ethene homopolymer, silicone oil, grease, natural oils or fats, mold release agents for composites manufacturing, natural gums (e.g. xanthan gum, guar gum, gum arabic dissolved in water) or pectins in water or other viscous or thixotropic substances. The mask material may dry, thicken or harden after application, as this will further prevent dripping or uncontrollable flow or movement of the mask material.

Preferably, the mask material is immiscible with the resin used to fabricate the tank. For example, the mask material can be immiscible in polyester resin or epoxy.

Optionally the mask material is removable with a solvent (e.g. water) that does not damage or attack the finished, cured resin material.

In another embodiment, the impermeable film 44 is used as a mask to inhibit infiltration of the liquid resin into the conductive fiber material. The impermeable film 44 is impermeable to the liquid resin used to fabricate the tank. A method according to this embodiment is described in reference to FIGS. 8A-8E.

Figure 8A:
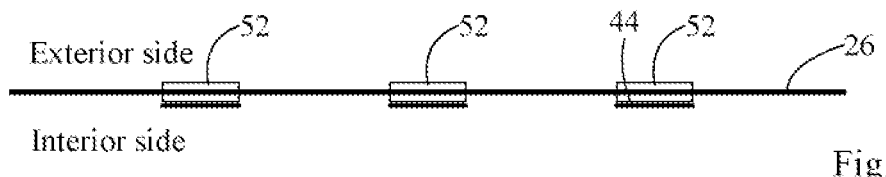
FIGS. 8A-8E illustrate a method for making a tank according to the present invention in which an impermeable film is used as a mask on the conductive fiber material.

FIG. 8A: The conductive fiber material 26 is shown edge-on. Impermeable film 44 is disposed over masked areas 52 on the interior side of the conductive fiber material 26. Alternatively, the impermeable film 44 can be disposed on the exterior side. As noted above, the impermeable film 44 can comprise adhesive tape, and be made of a durable polymer such as polyethylene or polyimide. Also, the impermeable film 44 can be used in combination with the liquid or gel mask material described above. Liquid/gel mask material can be infiltrated into the fiber material, and then the impermeable film 44 can be adhered to the masked areas 52.

Figure 8B:
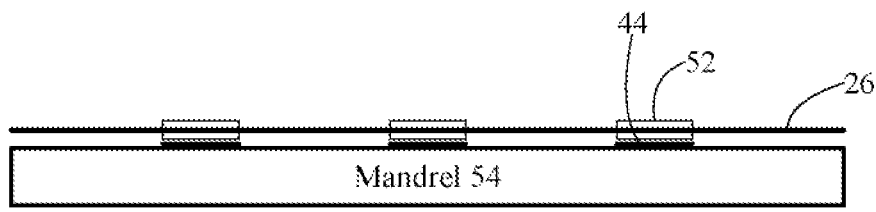

FIG. 8B: The masked fiber material 26 is disposed on the mandrel 54. The impermeable film 44 is disposed between the mandrel and the fiber material 26, but this arrangement is optional in the invention. In another embodiment, the fiber material 26 is disposed between the impermeable film 44 and the mandrel 54. So, the impermeable film 44 can be applied to one or both sides of the conductive fiber material 26. The fiber material 26 can be attached to the mandrel 54 with adhesive tape (not shown).

Figure 8C:
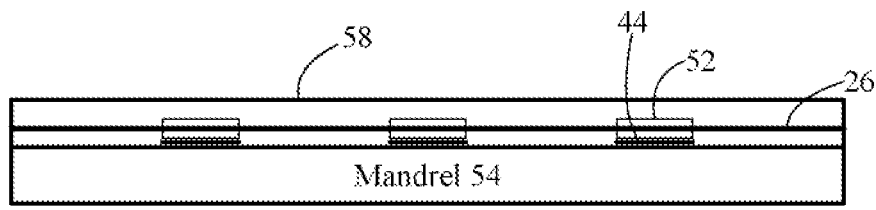

FIG. 8C: Structural fiber and liquid resin are applied over the mandrel 54 and fiber material 26. The liquid resin infiltrates the conductive fiber material 26 in locations outside the masked areas 52. The resin is cured.

Figure 8D:

FIG. 8D: After the liquid resin is cured, the tank structure is separated from the mandrel 54.

Figure 8E:
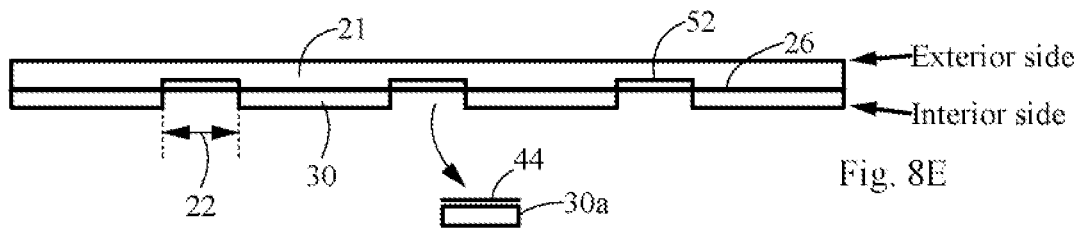

FIG. 8E: The resin covering sections 30a are removed from over the masked areas 52. The impermeable film 44 facilitates the detachment of the resin covering sections 30a. Removal of the resin covering sections 30a leaves portions of the conductive fiber material 26 exposed in the open areas 22. The impermeable film 44 might remain attached to the resin covering sections 30a.

In another embodiment of the present invention, impermeable film 44 is applied to both interior and exterior sides of the conductive fiber material 26. FIGS. 9A-9E illustrate steps in the assembly process in which impermeable film 44 is applied to both sides of the fiber material 26.

Figure 9A:
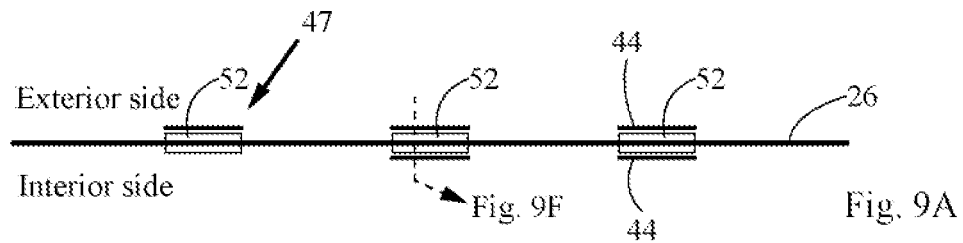
FIGS. 9A-9E illustrate a method for making a tank according to the present invention in which impermeable film is applied to both sides of the conductive fiber material.

FIG. 9A: Impermeable film 44 is disposed over masked areas 52 on one or both sides of the conductive fiber material 26. Liquid or gel mask material can also be applied to masked areas 52. The masked area 52 on the left side 47 has an impermeable film only on the exterior side of the conductive fiber material 26.

The impermeable film 44 can form a tube around the fiber material. FIG. 9F shows a cross sectional view of fiber material that is surrounded by tube of impermeable film 44. Impermeable film 44 can comprise two pieces, with one piece on each side of the fiber material. The impermeable film pieces 44 are wider than the fiber material 26, and therefore are in contact at edges 45, forming the tube that surrounds the fiber material 26. The edges 45 can stick together by adhesive, for example in embodiments where the impermeable film 44 comprises adhesive tape. Optionally, the tube of impermeable film 44 can be filled with liquid or gel mask material.

Figure 9B:
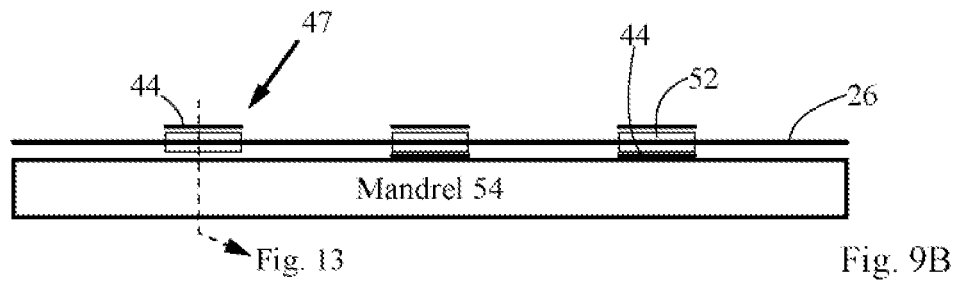

FIG. 9B: The masked fiber material 26 is disposed on a mandrel 54. In an alternative embodiment, the masked area 47 is attached to the mandrel 54 by the impermeable film 44, which may comprise adhesive tape. A cross sectional view of such attachment is illustrated in the cross sectional view of FIG. 13.

Figure 9C:
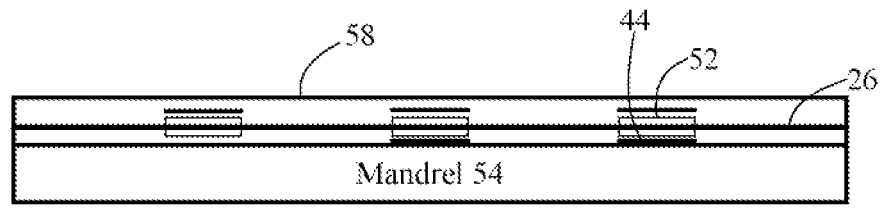

FIG. 9C: Structural fiber and liquid resin are applied over the mandrel 54 and fiber material 26. The liquid resin infiltrates the conductive fiber material 26 in locations outside the masked areas 52. The resin is cured.

Figure 9D:
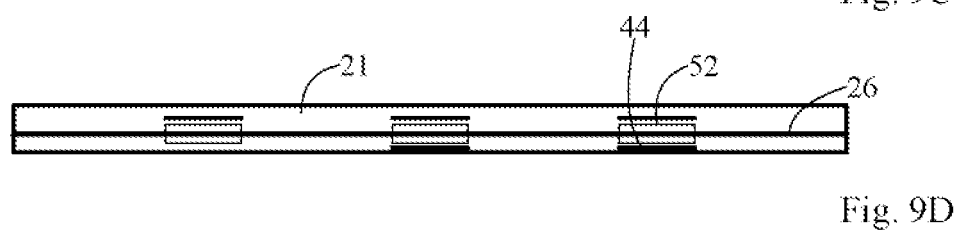

FIG. 9D: After the liquid resin is cured, the tank structure is separated from the mandrel 54.

Figure 9E:
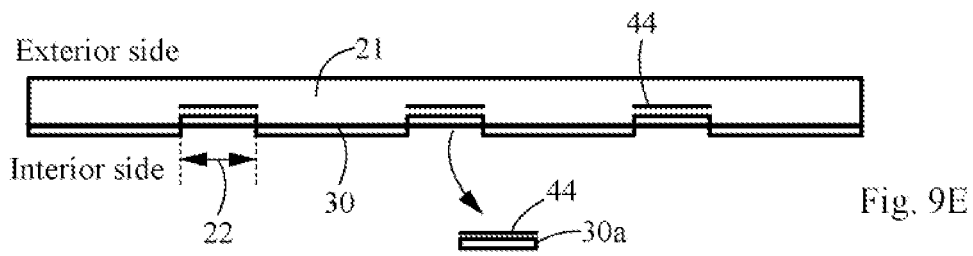
Figure 9F:
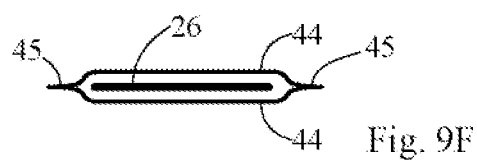
FIG. 9F shows a cross sectional view of conductive fiber material with impermeable film surrounding the conductive fiber material. The impermeable film forms a tube around the conductive fiber material.

FIG. 9E: The resin covering sections 30a are removed from over the masked areas 52. The impermeable film 44 facilitates the detachment of the resin covering sections 30a. Removal of the resin covering sections 30a leaves portions of the conductive fiber material 26 exposed in the open areas 22. The impermeable film 44 might remain attached to the resin covering sections 30a. The impermeable film 44 may also remain in the final product on the exterior side of the fiber material 26 (i.e. between the fiber material 26 and tank wall 21), as it may be adhered to cured resin comprising the tank wall 21, and may be difficult to remove from behind the conductive fiber material 26.

The present invention also includes a method for attaching the conductive fiber material 26 to a surface, such as a tank interior surface. In this method, the mask is used to prevent infiltration of the resin that would cover the broken fiber tips 28 and stray fibers 29.

FIGS. 10A-10D illustrate the present method for attaching the fiber material to a tank interior surface, or other surface.

Figure 10A:
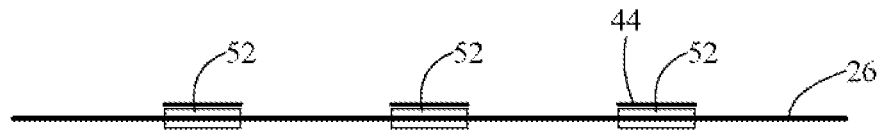
FIGS. 10A-10D illustrate a method for adhering a conductive fiber material to the inside surface of a tank, in which a mask is used to inhibit the spreading or capillary flow of resin in the conductive fiber material.

FIG. 10A: Mask material and/or impermeable film 44 is applied to masked areas 52 of the conductive fiber material 26, as explained above. In FIG. 10A, the impermeable film 44 is shown applied to only one surface. However, impermeable film 44 can be applied to one side or two opposing sides of the fiber material 26.

Figure 10B:
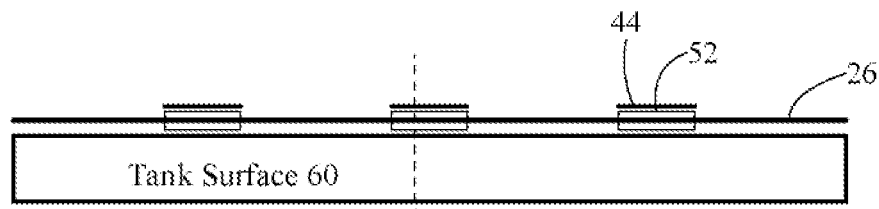

FIG. 10B: The masked fiber material 26 is disposed on a surface 60 where the conductive fiber material is desired. The surface 60 can be the interior surface of a tank, for example.

Figure 10C:
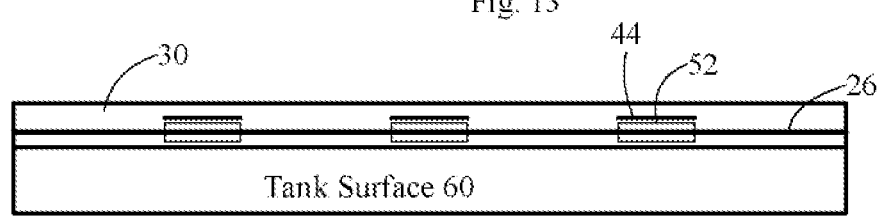

FIG. 10C: A resin covering 30 is applied. The covering 30 can comprise liquid resin only, or a composite of resin and structural fiber material. The structural fiber can be fiberglass or carbon fiber in the form of a fabric or chopped fibers, for example. The resin covering 30 can be applied over the entire fiber material 26, or can be applied approximately only in locations outside the masked areas 52. After the resin covering 30 is applied, it is allowed to cure.

Figure 10D:
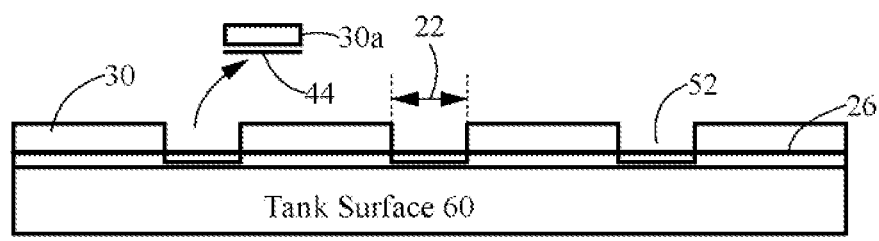

FIG. 10D: After the resin covering 30 is cured, resin covering sections 30a are removed from over the masked areas 52, thereby creating open areas 22 where the conductive fiber material 26 is exposed and capable of absorbing nearby electrostatic charge. The resin covering 30 also bonds to the tank surface 60, thereby permanently attaching the conductive fiber material 26 to the surface 60.

Figure 11:
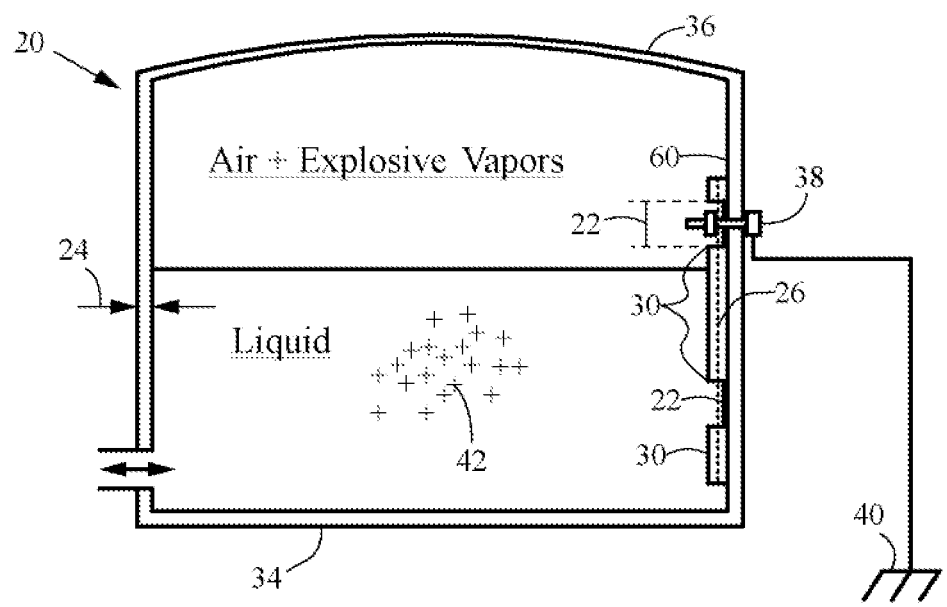
FIG. 11 shows a cross sectional view of a tank with a conductive fiber material adhered to an inside surface of the tank according to the method illustrated in FIGS. 10A-10D.

FIG. 11 shows a tank with a conductive fiber material 26 adhered to an interior surface 60 according to the method illustrated in FIGS. 10A-10D. The tank will be very similar or essentially identical to the tank of FIG. 3. However, unlike the embodiment of FIG. 3, the resin covering 30 may be raised above the interior tank surface 60.

In FIG. 11, the bolt 38 is located in the open area 22 and functions as an electrical feedthrough between the conductive fiber material 26 and the ground potential 40.

Figure 12:
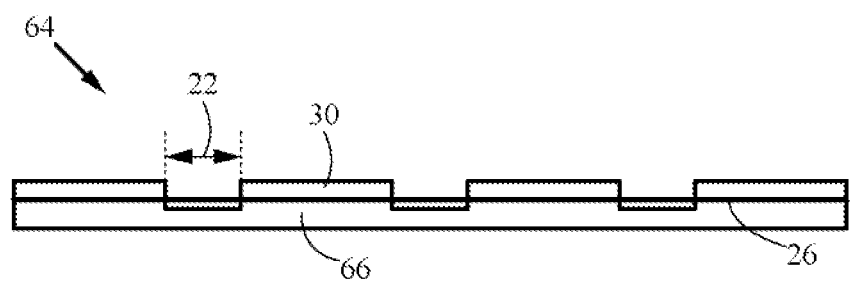
FIG. 12 shows a static dissipative panel according to the present invention.

The present invention also provides a static-dissipating panel. FIG. 12 shows a panel 64 according to the present invention. The panel comprises a flat or curved sheet or strip of fiber-composite material 66. The panel has the open area 22 where the conductive fiber material 26 is exposed. Resin covering 30 covers the conductive fiber material 26 in locations outside the open areas 22. The present panel 64 can be bolted, glued or otherwise attached to an interior surface of a tank or other structure where static dissipation is desired.

Figure 13:
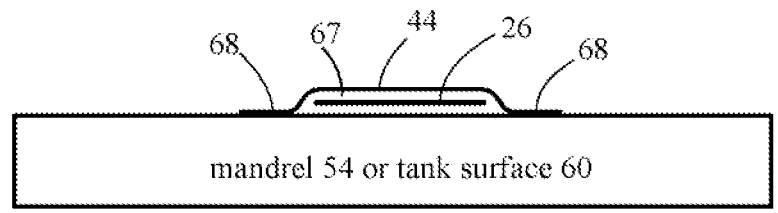
FIG. 13 shows cross sectional view of a step in a method for making the present invention in which the conductive fiber material is adhered to the mandrel or tank surface with impermeable film comprising adhesive tape.

In the methods of the present invention, the conductive fiber material 26 can be attached to the mandrel 54 or tank surface 60 by the mask. For example, FIG. 13 shows a cross sectional view of a step according to a method in which the conductive fiber material 26 is attached to the mandrel 54 or tank surface 60 with impermeable film 44 comprising adhesive tape. The impermeable film adhesive tape 44 is wider than the conductive fiber material 26 and sticks to the mandrel 54 or tank surface 60 in areas 68 adjacent to the fiber material 26. A space 67 between the impermeable film 44 and mandrel 54/tank surface 60 can be filled with liquid or gel mask material. Accordingly, the impermeable film 44 functions as both a mask and a means for attaching the conductive fiber material 26 to the mandrel 54 or tank surface 60. If the seal at edges 68 is tight and does not allow entry of liquid resin, then in some embodiments there might be no resin covering 30a requiring removal.

Alternatively, the liquid/gel mask material can have adhesive properties sufficient to adhere the conductive fiber material to the mandrel 54 or tank surface 60.

The present invention can provide static-dissipative objects of many shapes for many different applications. The present invention is not limited to making tanks or panels. The mandrel 54 can be replaced with a mold of any shape for making a wide variety of composite structures or parts with exposed conductive fiber. For example, the present invention can be used to manufacture windmill blades, airplane components, vehicle components, boat hulls, pipes or another other composite object requiring charge dissipation. The present invention can be used to make any composite object with an electrically conductive surface.

The following is a table of reference numerals used in this application:

| Reference Numeral | Description |
|---|---|
| 10 | tank |
| 11 | pipe connection |
| 12 | metal twisted wire brush |
| 13 | ground potential |
| 14 | twisted cable |

-continued

| Reference Numeral | Description |
|---|---|
| 15 | embedded small diameter |
| 20 | tank |
| 22 | open area |
| 21 | walls |
| 24 | thickness |
| 26 | conductive fiber material |
| 28 | broken fiber tips |
| 29 | stray fibers |
| 30 | resin covering |
| 30a | resin covering sections |
| 32 | edges |
| 34 | tank bottom |
| 36 | tank top |
| 38 | bolt |
| 40 | ground potential |
| 42 | electrostatic charge |
| 43 | optional space |
| 44 | impermeable film |
| 46 | area |
| 52 | masked areas |
| 52a | masked area |
| 52b | masked area |
| 52c | masked area |
| 54 | cylindrical mandrel |
| 56 | axis of rotation |
| 58 | structural fiber strip |
| 59 | spool |
| 57 | line |
| 60 | surface |
| 64 | panel |
| 66 | flat or curved sheet or strip of fiber-composite material |
| 68 | areas |

The above embodiments may be altered or combined with each other in many ways without departing from the scope of the invention. Accordingly, the scope of the invention should be determined by the following claims and their legal equivalents.

What is claimed is:

1. A method for making an object with an electrically conductive surface, comprising the steps of:
    (a) applying a plurality of masks to a conductive fiber material, wherein the plurality of masks inhibits infiltration of a liquid resin into the conductive fiber material;
    (b) disposing the conductive fiber material and the plurality of masks on the electrically conductive surface;
    (c) disposing the liquid resin on the conductive fiber material and the plurality of masks, such that the liquid resin infiltrates the unmasked areas of the conductive fiber material;
    (d) curing the liquid resin; and
    (e) after step "(d)", removing the plurality of masks from the conductive fiber material, such that the conductive fiber material becomes exposed in the previously masked areas.

2. The method of claim 1, wherein the plurality of masks comprises an impermeable film, and step "(a)" comprises applying the impermeable film to at least one side of the conductive fiber material.

3. The method of claim 2, wherein the impermeable film comprises a tube disposed around the conductive fiber material.

4. The method of claim 2, wherein the object comprises a tank, and wherein, in step "(e)" the mask is removed from an inside surface of the tank.

5. The method of claim 1, wherein step "(a)" comprises applying a plurality of liquid or gum or gel masks to the conductive fiber material such that the liquid or gum or gel of the plurality of liquid or gum or gel masks infiltrate into the conductive fiber material.

6. The method of claim 5, wherein the plurality of liquid or gum or gel masks are insoluble in the liquid resin.

7. The method of claim 1, wherein step "(b)" is performed before step "(a)".

8. The method of claim 1, wherein step "(e)" comprises removing the cured resin from the masked areas.

9. The method of claim 1, wherein step "(b)" comprises wrapping the structural fiber material around the conductive fiber material.

10. The method of claim 1, wherein the plurality of masks is water-dispersable or water-soluble, and step "(a)" includes rinsing the masked areas with water.

11. The method of claim 1, wherein the plurality of masks comprises a liquid or gum or gel, and the further comprises the step of at least partially drying the liquid or gum or gel before liquid resin is applied.

12. The method of claim 1, wherein the plurality of masks comprises a combination of:
    (i) a liquid or gum or gel infiltrated into the conductive fiber material, and
    (ii) an impermeable film applied to the conductive fiber material.

13. A method for applying a conductive fiber material to a surface, comprising the steps of:
    (a) applying a plurality of mask blocks to a conductive fiber material thereby forming a masked conductive fiber material having an unmasked area and a plurality of mask blocked areas, wherein the plurality of mask blocks inhibits infiltration of a liquid resin;
    (b) after step "(a)", disposing the masked conductive fiber on the surface;
    (c) applying liquid resin on the masked conductive fiber material and the surface, such that the liquid resin infiltrates the unmasked area of the conductive fiber material;
    (d) curing the resin, such that the conductive fiber material is adhered to the surface by the cured resin; and
    (e) removing the plurality of mask blocks from masked areas of the conductive fiber material, such that the conductive fiber material becomes exposed in the previously masked areas.

14. The method of claim 13, wherein step "(a)" comprises applying an impermeable film to at least one side of the conductive fiber material.

15. The method of claim 14, wherein the impermeable film comprises a tube around the conductive fiber material.

16. The method of claim 14, wherein the impermeable film comprises adhesive tape, and the adhesive tape mask attaches the conductive fiber material to the surface.

17. The method of claim 13, wherein step "(a)" comprises applying a plurality of liquid or gum or gel masks to the conductive fiber material such that the liquid or gum or gel infiltrates into the conductive fiber material.

18. The method of claim 13, wherein step "(b)" is performed before step "(a)".

19. The method of claim 13, wherein the surface is an interior surface of a tank.

20. The method of claim 13, wherein step "(e)" includes removing the cured resin from the masked areas.

* * * * *